(12) United States Patent
Han et al.

(10) Patent No.: US 12,012,537 B2
(45) Date of Patent: Jun. 18, 2024

(54) METHOD OF FLUORESCENT NANODIAMONDS PRODUCTION

(71) Applicant: KOREA INSTITUTE OF SCIENCE AND TECHNOLOGY, Seoul (KR)

(72) Inventors: Seung Hee Han, Seoul (KR); Sung Ju Han, Seoul (KR); Min Seo, Seoul (KR); Min Gyeong Cho, Seoul (KR)

(73) Assignee: KOREA INSTITUTE OF SCIENCE AND TECHNOLOGY, Seoul (KR)

(*) Notice: Subject to any disclaimer, the term of this patent is extended or adjusted under 35 U.S.C. 154(b) by 504 days.

(21) Appl. No.: 17/319,095

(22) Filed: May 13, 2021

(65) Prior Publication Data

US 2021/0371742 A1 Dec. 2, 2021

(30) Foreign Application Priority Data

May 29, 2020 (KR) .................. 10-2020-0064748

(51) Int. Cl.
*C09K 11/65* (2006.01)
*B82B 3/00* (2006.01)
(Continued)

(52) U.S. Cl.
CPC ............. *C09K 11/65* (2013.01); *B82B 3/008* (2013.01); *C01B 32/26* (2017.08); *C01B 32/28* (2017.08);
(Continued)

(58) Field of Classification Search
CPC . C23C 14/5853; C23C 14/5806; C23C 14/48; C23C 14/0611; B82Y 40/00
See application file for complete search history.

(56) References Cited

U.S. PATENT DOCUMENTS

2015/0276754 A1* 10/2015 Shirakawa ......... G01N 33/6803
568/817
2018/0209038 A1* 7/2018 Okahisa .................. C23C 14/48

FOREIGN PATENT DOCUMENTS

JP 2017202940 A * 11/2017
WO 2014/058012 A1 4/2014
WO 2015/199180 A1 12/2015

OTHER PUBLICATIONS

Arnault et al. (Phys. Chem. Chem. Phys. 2011, 13, pp. 11481-11487) (Year: 2011).*

(Continued)

*Primary Examiner* — Kelly M Gambetta
(74) *Attorney, Agent, or Firm* — CANTOR COLBURN LLP (57) ABSTRACT

The present invention relates to a fluorescent nanodiamond preparing method including a first operation of preparing nanodiamonds having an average particle diameter of 10 nm or less, a second operation of implanting plasma ions into the nanodiamonds, a third operation of heat-treating the nanodiamonds implanted with the plasma ions under a vacuum or inert gas atmosphere, a fourth operation of oxygen treatment of the heat-treated nanodiamonds under a gas atmosphere including oxygen to oxidize the surfaces of the nanodiamonds, a fifth operation of acid-treating the oxygen-treated nanodiamonds, a sixth operation of centrifuging and cleaning the acid-treated nanodiamonds, and a seventh operation of drying the cleaned nanodiamonds, wherein, in the second operation, the plasma ions are implanted at an incident ion dose of $10^{13}$ ions/cm$^2$ or more and $10^{20}$ ions/cm$^2$ or less.

16 Claims, 6 Drawing Sheets

(51) Int. Cl.
- B82Y 20/00 (2011.01)
- B82Y 40/00 (2011.01)
- C01B 32/26 (2017.01)
- C01B 32/28 (2017.01)
- C23C 14/06 (2006.01)
- C23C 14/48 (2006.01)
- C23C 14/58 (2006.01)
- C30B 31/20 (2006.01)
- C30B 33/00 (2006.01)
- G01N 21/64 (2006.01)

(52) U.S. Cl.
CPC .......... *C23C 14/0611* (2013.01); *C23C 14/48* (2013.01); *C23C 14/5806* (2013.01); *C23C 14/5853* (2013.01); *C30B 31/20* (2013.01); *C30B 33/00* (2013.01); *B82Y 20/00* (2013.01); *B82Y 40/00* (2013.01); *C01P 2002/72* (2013.01); *C01P 2002/86* (2013.01); *C01P 2004/04* (2013.01); *C01P 2004/64* (2013.01); *G01N 2021/6439* (2013.01)

(56) References Cited

OTHER PUBLICATIONS

Korean Office Action for KR Application No. 10-2020-0064748 dated Sep. 28, 2021, citing the above reference(s).

Chi-Cheng Fu et al., "Characterization and application of single fluorescent nanodiamonds as cellular biomarkers," PNAS, Jan. 16, 2007, pp. 727-732, vol. 104, No. 3.

Jean-Paul Boudou et al., "High yield fabrication of fluorescent nanodiamonds," Nanotechnology, 2009, 11 pages, vol. 20, IOP Publishing Ltd.

Yuen Yung Hui et al., "Nanodiamonds for optical bioimaging," Journal of Physics D: Applied Physics, 2010, 11 pages, vol. 43, IOP Publishing Ltd.

* cited by examiner

METHOD OF FLUORESCENT NANODIAMONDS PRODUCTION

CROSS-REFERENCE TO RELATED APPLICATION

The present application claims priority under 35 U.S.C. § 119 to Korean Application No. 10-2020-0064748 filed on May 29, 2020 the entire content of which is incorporated herein by reference.

BACKGROUND

1. Field of the Invention

The present invention relates to a method of fluorescent nanodiamonds production. Specifically, the method of fluorescent nanodiamonds production of the present invention is suitable for mass production, does not require a separate pulverizing process, is economical, and is capable of providing fluorescent nanodiamonds having high photostability and having no cytotoxicity.

2. Discussion of Related Art

Organic dyes, fluorescent proteins, and semiconductor quantum dots are used as the conventional fluorescent materials for bioimaging but have disadvantages such as low photostability and bioincompatibility. As new fluorescent materials for solving such problems, fluorescent nanodiamonds having high photostability and having no cytotoxicity are emerging (Hui, Y. Y. et al, (2010), Nanodiamonds for optical bioimaging, Journal of Physics D: Applied Physics 2010, 43(37), 374021).

Nanodiamonds are diamonds having a size of 100 nm or less and have the natural structure, hardness, durability, and chemical inertness of a diamond. Nanodiamonds have various defects that absorb and emit light, and among the defects, nitrogen-vacancy centers are receiving the most attention. The nitrogen-vacancy center has two states such as $nv^0$ that is a neutral state and $nv^-$ that is a negatively charged state. When a laser with a wavelength of 532 nm is irradiated thereonto, the nitrogen-vacancy center emits light at each of wavelengths of 575 nm and 638 nm. Usually, biomolecules absorb light at a wavelength of 300 nm to 500 nm and emit auto-fluorescence at a wavelength of 400 nm to 550 nm, and nanodiamonds having nitrogen-vacancy centers, which do not interfere with the corresponding wavelength and do not show a photo-bleaching phenomenon, may be regarded as excellent fluorescent materials for bioimaging (Fu, C.-C. et al, (2007), Characterization and application of single fluorescent nanodiamonds as cellular biomarkers, Proceedings of the National Academy of Sciences, 104(3), 727-732).

Currently, in a fluorescent nanodiamond preparing method, after electrons or ions are accelerated at a high energy of several MeV and incident into a type-Ib HPHT synthetic diamond including nitrogen with a size of several tens of microns or more by using an expensive particle accelerator to form vacancies, heat treatment is performed to form nitrogen-vacancy color centers, and then, a pulverizing process is performed through several operations to reduce a size of the fluorescent nanodiamond (Boudou, J.-P. et al, (2009), High yield fabrication of fluorescent nanodiamonds, Nanotechnology, 20(35), 359801). However, such a method is very expensive due to low economic feasibility and productivity, and it is difficult to reduce a size of the fluorescent nanodiamond to 35 nm or less.

In addition, the currently commercialized fluorescent nanodiamonds having a size of 10 nm or less have a very low fluorescence color center concentration.

SUMMARY OF THE INVENTION

The present invention is to directed to solving problems of low photostability, bioincompatibility, and cytotoxicity of fluorescent materials for bioimaging and to solving low economic feasibility and productivity due to use of a particle accelerator and a pulverizing process.

The present invention is also directed to solving a problem of a low fluorescence color center concentration of fluorescent nanodiamonds having a size of 10 nm or less.

According to an aspect of the present invention, there is provided a method of fluorescent nanodiamonds production including a first operation of preparing nanodiamonds having an average particle diameter of 10 nm or less; a second operation of implanting plasma ions into the nanodiamonds; a third operation of heat-treating the nanodiamonds implanted with the plasma ions under a vacuum or inert gas atmosphere; a fourth operation of oxygen-treatment of the previously heat-treated nanodiamonds under a gas atmosphere including oxygen to oxidize the surfaces of the nanodiamonds; a fifth operation of acid-treating the oxygen-treated nanodiamonds; a sixth operation of centrifuging and cleaning the acid-treated nanodiamonds; and a seventh operation of drying the cleaned nanodiamonds, wherein, in the second operation, the plasma ions are implanted at an incident ion dose of $10^{13}$ ions/$cm^2$ or more and $10^{20}$ ions/$cm^2$ or less.

In the method according to one embodiment of the present invention, by using plasma immersion ion implantation technology capable of implanting ions into a large area sample, vacancies can be formed more efficiently as compared with ion-beam ion implantation equipment. Therefore, it is possible to solve a low productivity problem of the particle accelerator.

The method according to one embodiment of the present invention is freely applicable in biological fields because bio-friendly nanodiamonds are used to solve disadvantages such as cytotoxicity and bioincompatibility of organic dyes, fluorescent proteins, and semiconductor quantum dots.

The method according to one embodiment of the present invention does not require a complicated separate pulverizing process. Therefore, as compared with a fluorescent nanodiamond preparing method based on an HPHT synthetic diamond, which requires a separate pulverizing process, economical feasibility and efficiency are high.

Fluorescent nanodiamonds prepared according to one embodiment of the present invention can solve a problem of low photoluminescence intensity.

DETAILED DESCRIPTION OF EXEMPLARY EMBODIMENTS

Advantages and features of the present invention and methods for accomplishing the same will be more clearly understood from embodiments described below with reference to the accompanying drawings. It should be understood that the present invention is not limited to the following embodiments but may be implemented in various different forms. The embodiments are provided only to complete the disclosure of the present invention and to fully provide a person having ordinary skill in the art to which the present invention belongs with the category of the present invention. The present invention is only defined by the scope of accompanying claims. Like reference numerals generally denote like elements throughout the present specification.

Unless otherwise defined, all terms (including technical and scientific terms) used in the present specification may be used with the same meaning which may be commonly understood by the person with ordinary skill in the art to which the present invention belongs. In addition, it will be further understood that terms defined in commonly used dictionaries should not be interpreted in an idealized or excessive sense unless expressly and specifically defined.

In addition, unless explicitly described to the contrary, the term "comprise (include)" will be understood to imply the inclusion of stated components but not the exclusion of any other components.

In the present specification, the term "vacancy" may mean a defect caused when an atom is missing from a lattice site of a diamond.

In addition, in the present specification, a nitrogen-vacancy center can be formed as a result of pairing a lattice vacancy with a nitrogen atom.

Hereinafter, the present invention will be described in detail.

One embodiment of the present invention provides a method of fluorescent nanodiamonds production including a first operation of preparing nanodiamonds having an average particle diameter of 10 nm or less; a second operation of implanting plasma ions into the nanodiamonds; a third operation of heat-treating the nanodiamonds implanted with the plasma ions under a vacuum or inert gas atmosphere; a fourth operation of oxygen-treatment of the heat-treated nanodiamonds under a gas atmosphere including oxygen to oxidize the surfaces of the nanodiamond; a fifth operation of acid-treating the oxygen-treated nanodiamonds; a sixth operation of centrifuging and cleaning the acid-treated nanodiamonds; and a seventh operation of drying the cleaned nanodiamonds, wherein, in the second operation, the plasma ions are implanted at an incident ion dose of $10^{13}$ ions/cm$^2$ or more and $10^{20}$ ions/cm$^2$ or less.

In the second operation of implanting the plasma ions into the nanodiamonds, when the incident ion dose is less than $10^{13}$ ions/cm$^2$, it is difficult to form effective nitrogen-vacancy color centers. In addition, in the second operation of implanting the plasma ions, when the incident ion dose exceeds $10^{20}$ ions/cm$^2$, defects of the nanodiamonds are generated due to an ion implanting process, thereby resulting in degradation of fluorescence properties and resulting in a decrease in economic feasibility due to an increase in an ion implanting process time.

Fluorescent nanodiamonds prepared according to the method according to one embodiment of the present invention are freely applicable in biological fields because bio-friendly nanodiamonds are used to solve disadvantages such as cytotoxicity and bioincompatibility of organic dyes, fluorescent proteins, and semiconductor quantum dots. In addition, it is possible to solve a problem of a low photoluminescence intensity of fluorescent nanodiamonds having an average particle diameter of 10 nm or less.

In one embodiment of the present invention, the nanodiamonds having an average particle diameter of 10 nm or less in the first operation may be prepared through a detonation method. According to one embodiment of the present invention, when the nanodiamonds prepared through the detonation method are used, complicated separate pulverizing, masking, and plasma etching processes are not required. Therefore, as compared with a fluorescent nanodiamond preparing method based on a high-temperature and high-pressure (HPHT) synthetic diamond, which requires a separate pulverizing process, economical feasibility and efficiency are high.

In the method according to one embodiment of the present invention, vacancies are formed in the nanodiamonds using the second operation of implanting the plasma ions into the prepared nanodiamonds having an average particle diameter of 10 nm or less. According to one embodiment of the present invention, when plasma ion implantation technology is used, ions can be implanted into a large area sample, and vacancies can be formed more efficiently as compared with a particle accelerator, thereby solving a low productivity problem of the particle accelerator.

In one embodiment of the present invention, the second operation is performed at a plasma ion implantation voltage of −10 kV or more and −40 kV or less. When the second operation is performed at a plasma ion implantation voltage that is less than −10 kV, it is difficult to form nitrogen-vacancy color centers, and when the second operation is performed at a plasma ion implantation voltage that exceeds −40 kV, the difficulty of a high voltage pulse generator may be increased, and thus, economic feasibility may be decreased.

In one embodiment, the second operation performed with at least one process gas selected from the group consisting of helium (He), nitrogen (N), neon (Ne), and argon (Ar).

In one embodiment of the present invention, the second operation is performed at a pressure of 0.5 mTorr or more and 10 mTorr or less. At a low pressure in which a process gas pressure in the second operation is less than 0.5 mTorr, it is difficult to generate plasma, and at a high pressure in which the process gas pressure exceeds 10 mTorr, due to frequent collisions between plasma ions accelerated during plasma ion implantation and surrounding gas particles, the energy loss of the accelerated plasma ions may be very severe.

In another embodiment, the second operation is performed at a high voltage pulse width of 5 μs or more and 100 μs or less. When the second operation is performed at a pulse width that is less than 5 μs, plasma ion implantation may not be effectively performed, and when the second operation is performed at a long pulse width that exceeds 100 μs, plasma may be likely to be turned off. In addition, as a time for a high voltage to be applied is increased, an arc may occur in a sample, which makes it difficult to perform a plasma ion implanting process.

In one embodiment, the second operation is performed at a pulse frequency of 1 Hz or more and 1,000 Hz or less. When the second operation is performed at a low pulse frequency that is less than 1 Hz, the plasma ion implanting process takes too much time, thereby resulting in a decrease in economic value, and when the second operation is performed at a high frequency that exceeds 1,000 Hz, there is difficulty in manufacturing an operating high voltage pulse generator.

Figure 2:
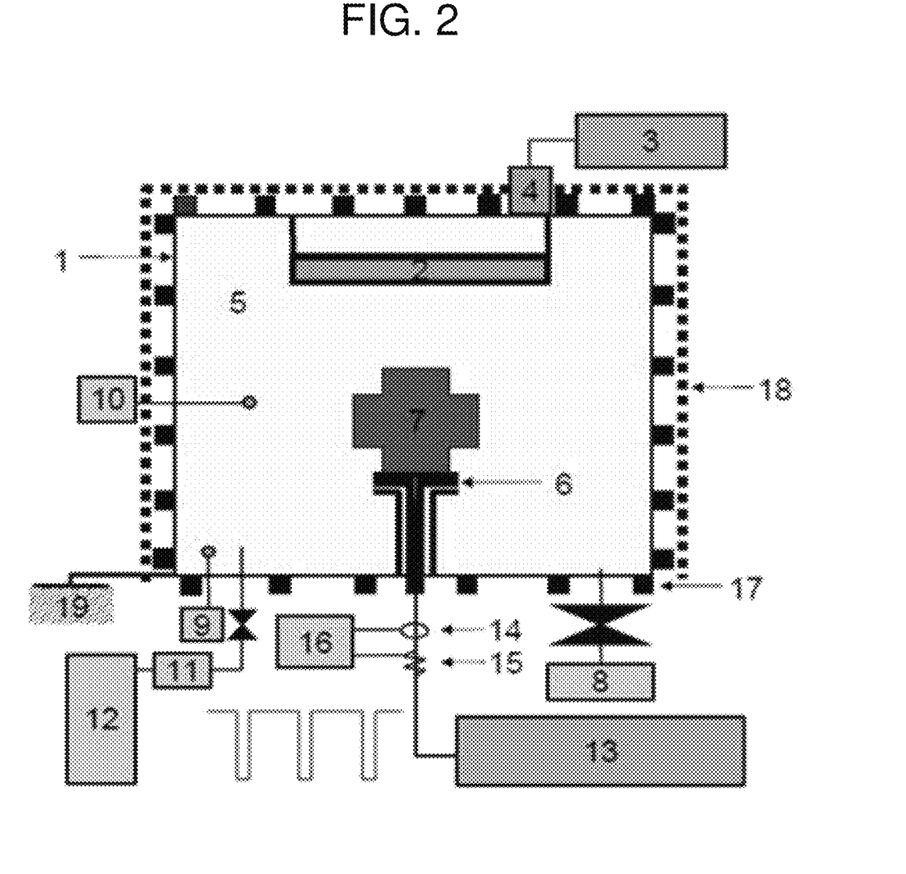
FIG. 2 is a schematic block diagram of a plasma ion implantation apparatus according to the present invention.

FIG. 2 is a schematic block diagram of a plasma ion implantation apparatus according to the present invention. Referring to FIG. 2 in detail, the plasma ion implantation apparatus according to one embodiment of the present invention includes a vacuum chamber 1, a vacuum pump 8 which makes the vacuum chamber 1 into a vacuum, a process gas 12 which generates a plasma source gas in the vacuum chamber 1, a gas flowmeter 11, an instrument current transformer 14, a radio frequency (RF) power supply device 3 which supplies RF power for generating plasma to an antenna 2, a matching network 4 which matches the RF power supply device 3 with the antenna 2, a sample table 6 to which a negative high voltage pulse is applied to accelerate and implant ions and which supports a nanodiamond sample, a high voltage pulse generator 13 which supplies a high voltage pulse to the sample table 6, and a high voltage divider 15 which measures a high voltage. Undescribed reference numeral 5 denotes plasma, undescribed reference numeral 7 denotes a sample, undescribed reference numeral 9 denotes an ion gauge, undescribed reference numeral 10 denotes s a Langmuir probe, undescribed reference numeral 16 denotes an oscilloscope, undescribed reference numeral 17 denotes a magnet, undescribed reference numeral 18 denotes a lead shielding wall, and undescribed reference numeral 19 denotes a ground portion of the vacuum chamber.

In the method according to one embodiment of the present invention, through the third operation of heat-treating the nanodiamonds implanted with the plasma ions under the vacuum or inert gas atmosphere, vacancies move and meet nitrogen atoms to form nitrogen-vacancy centers, and a diamond lattice is rearranged.

In one embodiment of the present invention, the third operation may be performed under the vacuum or inert atmosphere in order to avoid oxidation on the surfaces of the nanodiamonds.

In one embodiment of the present invention, a heat treatment temperature under the vacuum or inert gas atmosphere in the third operation may be 600° C. or more and 1,100° C. or less. When the heat treatment temperature under the vacuum or inert gas atmosphere is less than 600° C., there may be difficulty in forming nitrogen-vacancy color centers due to a low diffusion rate of vacancies, and when the heat treatment temperature under the vacuum or inert gas atmosphere exceeds 1,100° C., crystals of the nanodiamonds may be destroyed, thereby resulting in graphitization.

In one embodiment of the present invention, a heat treatment time under the vacuum or inert gas atmosphere in the third operation may be 10 seconds or more and 10 hours or less. Specifically, the heat treatment time of the third operation may be less than one hour. When the heat treatment time under the vacuum or inert gas atmosphere is less than 10 seconds, the diffusion of vacancies may be insufficient, which makes it difficult to form nitrogen-vacancy color centers, and when the heat treatment time under the vacuum or inert gas atmosphere exceeds 10 hours and the heat treatment is performed for a long time, the crystals of the nanodiamonds may be destroyed, thereby resulting in serious graphitization.

According to one embodiment of the present invention, through the fourth operation of heat-treating the heat-treated nanodiamonds under the gas atmosphere including oxygen to oxidize the surfaces of the nanodiamonds, $sp^2$ is removed from the surfaces of the nanodiamonds. In the present invention, the heat treatment under the gas atmosphere including oxygen is sufficient as long as an atmosphere is a gas atmosphere including oxygen. The heat treatment under the gas atmosphere including oxygen may be performed in air and is not specifically limited.

According to one embodiment of the present invention, a heat treatment temperature under the gas atmosphere including oxygen in the fourth operation is 350° C. or more and 600° C. or less. When the heat treatment temperature under the gas atmosphere including oxygen is less than 350° C., the removal of $sp^2$ from the surfaces may be insufficient, thereby resulting in degradation of fluorescence properties, and when the heat treatment temperature under the gas atmosphere including oxygen exceeds 600° C., the nanodiamonds themselves may be oxidized, thereby resulting in a decrease in yield.

In another embodiment, a heat treatment time under the gas atmosphere including oxygen in the fourth operation may be one hour or more and 70 hours or less. When the heat treatment time under the gas atmosphere including oxygen is less than one hour, the removal of $sp^2$ from the surfaces may be insufficient, thereby resulting in degradation of fluorescence properties, and when the heat treatment time under the gas atmosphere including oxygen exceeds 70 hours, the nanodiamonds themselves may be oxidized, thereby resulting in a decrease in yield.

In one embodiment of the present invention, metal impurities and residual $sp^2$ on the surfaces of the nanodiamond may be removed using the fifth operation of acid-treating the oxygen-treated nanodiamonds.

In one embodiment of the present invention, as an acid of the fifth operation, a mixture of hydrofluoric acid (HF) and nitric acid ($HNO_3$) may be used.

In another embodiment, the fifth operation of the acid-treating may be performed at a temperature of 40° C. or more and 150° C. or less. When an acid treatment temperature is less than 40° C., a treatment time may be excessively increased, thereby resulting in a decrease in economic feasibility, and when the acid treatment temperature exceeds 150° C., the acid may be rapidly evaporated, thereby resulting in a decrease in acid treatment effect.

In one embodiment of the present invention, the acid of the fifth operation may be rinsed using the sixth operation of centrifuging and cleaning the acid-treated nanodiamonds.

In one embodiment of the present invention, the centrifuging of the sixth operation is performed at a centrifugal acceleration of 1,000 g or more and 60,000 g or less. When the centrifugal acceleration of the centrifuging is less than 1,000 g, an acid cleaning effect may be degraded, and when the centrifugal acceleration of the centrifuging exceeds 60,000 g, an expensive large-sized centrifuge should be used, thereby resulting in a decrease in economic feasibility.

In another embodiment, the centrifuging of the sixth operation may be performed for a time of 10 minutes or more and 10 hours or less. When a centrifugation time is less than 10 minutes, an acid cleaning effect may be degraded, and when the centrifugation time exceeds 10 hours, economic feasibility may be decreased.

In one embodiment of the present invention, the seventh operation of drying the cleaned nanodiamonds is performed at a temperature of 40° C. or more and 200° C. or less. When a drying temperature is less than 40° C., the drying time may be increased, thereby resulting in a decrease in economic feasibility, and when the drying temperature exceeds 200° C., there may be difficulty in collecting the sample due to a boiling phenomenon.

In addition, in one embodiment of the present invention, the seventh operation may be performed at a pressure of $10^{-1}$ Torr or more and 770 Torr or less.

In one embodiment of the present invention, fluorescent nanodiamonds prepared through the method are provided. The fluorescent nanodiamonds have an average particle diameter of 10 nm or less and include fluorescent color centers having a higher concentration as compared with conventional fluorescent nanodiamonds.

Except that the fluorescent nanodiamonds are prepared through the above-described the method, the fluorescent nanodiamonds may be applied to the same field as fluorescent nanodiamonds known in the art. Specifically, the fluorescent nanodiamonds may be applied not only to various biological fields such as bioimaging, medicine delivering, bioindicators, and gene delivering but also to quantum information science fields such as quantum communication and quantum computation.

Hereinafter, the present invention will be described in detail through specific Examples. However, embodiments of the present invention may be changed in various forms and are not construed as limiting the scope of the present invention. The embodiments of the present invention are provided to more fully describe the present invention to those having ordinary knowledge in the art to which the present invention belongs.

Example

Figure 1:
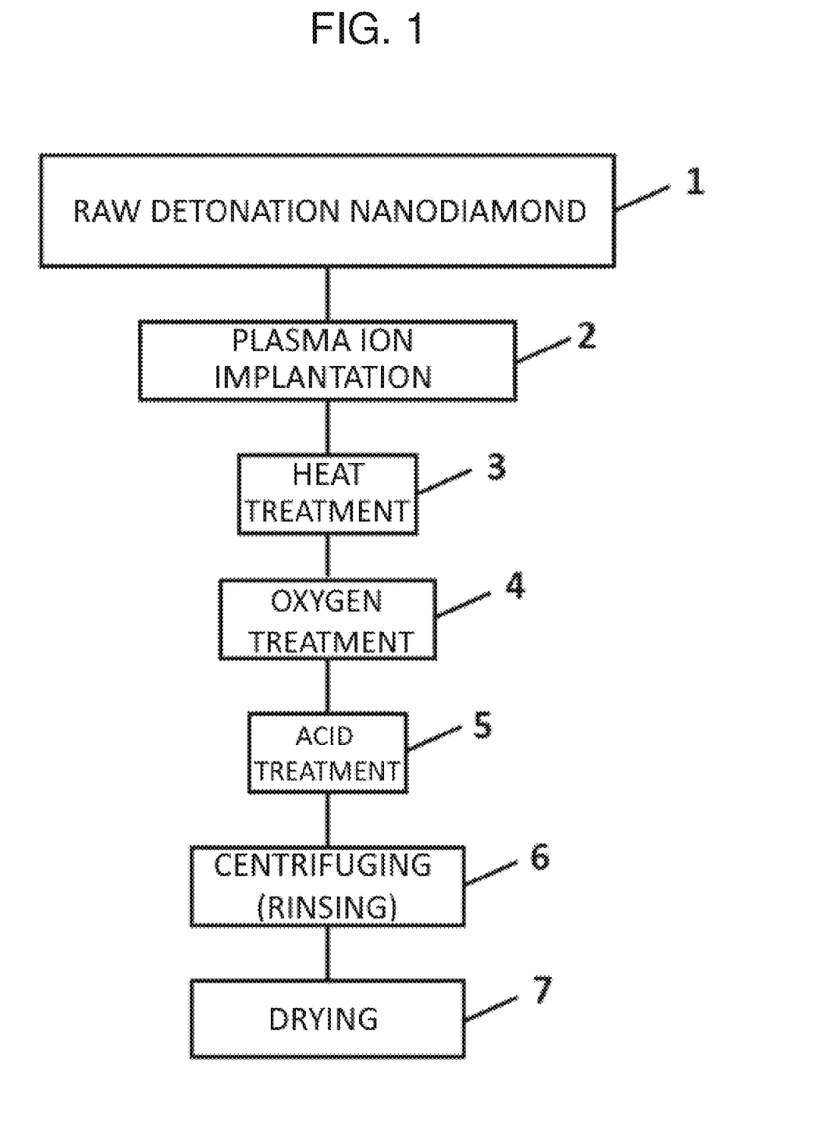
FIG. 1 is a flowchart of a preparing method according to one embodiment of the present invention.

FIG. 1 is a flowchart of a preparing method according to one embodiment of the present invention.

Specifically, in a first operation, a detonation nanodiamond (DND) powder prepared through a detonation method, which is a basic raw material, was put in a metal container, and ethanol was added to spread it uniformly on the bottom surface of the container. After ethanol was evaporated, a thin layer of DND was formed. The metal container was introduced into a plasma ion implantation chamber.

In a second operation, a nitrogen gas was injected into the plasma ion implantation chamber in a high vacuum state, a process pressure was set to 2 mTorr, and a plasma ion implantation frequency was set to 50 Hz. In such conditions, a high voltage of −20 kV with a pulse width of 15 μs was applied to the metal container, in which the DND layer was formed, to perform a plasma ion implanting process at an incident ion dose of $10^{16}$ ions/cm$^2$. The DND powder with vacancies formed through the plasma ion implanting process was transferred to an alumina container and then introduced into a vacuum rapid thermal annealing apparatus.

In a third operation, the DND powder implanted with plasma ions was loaded into the vacuum rapid thermal annealing apparatus and heat-treated at a temperature of 900° C. for 30 minutes under a vacuum atmosphere.

In a fourth operation, oxygen in an amount of 200 sccm was supplied to the vacuum rapid thermal annealing apparatus, a process pressure was fixed at 15 Torr, and then, an oxygen treatment process was performed at a temperature of 450° C. The oxygen treatment process was performed for about 8 hours. In the corresponding process, sp$^2$ was removed from surfaces of nanodiamonds formed through plasma ion implantation and vacuum heat treatment.

In a fifth operation, the oxygen-treated nanodiamond powder was added to a mixture of hydrofluoric acid (HF) and nitric acid (HNO$_3$), and acid treatment was performed at a temperature of 95° C. for about 12 hours.

In a sixth operation, after the acid treatment was completed, ultrapure purified water was added to the nanodiamond powder, sonicated for 30 minutes, and then centrifuged. The centrifuging was performed at a centrifugal acceleration of 9,605 g for about 3 hrs. After the centrifuging, the nanodiamonds were precipitated on a bottom, and the remaining acid supernatant at an upper side was discarded. Purified water was again poured over the precipitated nanodiamonds and sonicated, and then, centrifuging was secondarily performed under such centrifuging conditions to discard the acid supernatant again. Through such processes, sp$^2$, metallic impurities, and residual acids of the nanodiamonds were removed.

In a seventh operation, the centrifuged nanodiamonds were introduced into a vacuum oven and dried at a temperature of 80° C. to obtain final fluorescent nanodiamonds.

Figure 3:
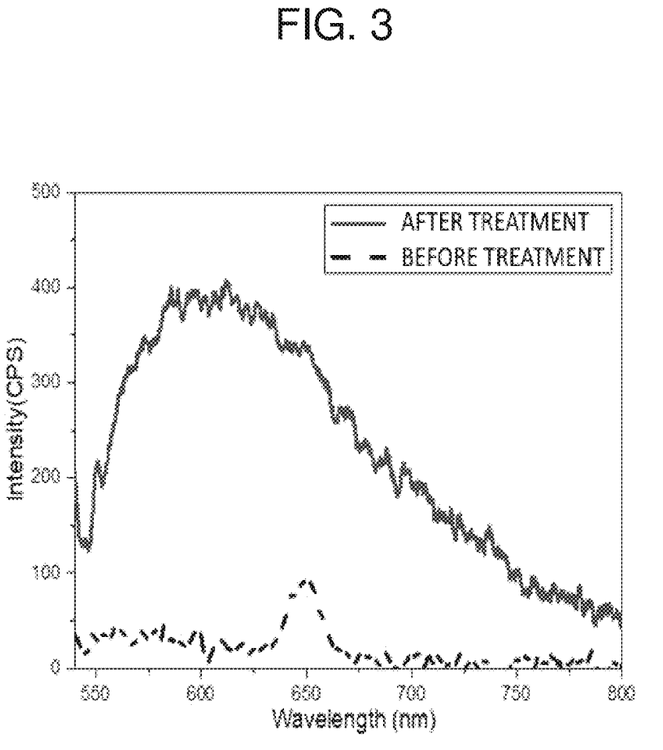
FIG. 3 is a graph showing light emission when a laser having a wavelength of 532 nm is irradiated onto fluorescent nanodiamonds prepared according to one embodiment of the present invention.

FIG. 3 is a graph showing light emission when a laser having a wavelength of 532 nm is irradiated onto the fluorescent nanodiamonds prepared according to one embodiment of the present invention. Specifically, FIG. 3 is a graph showing a comparison between fluorescence emission spectra at a wavelength of 532 nm of the fluorescent nanodiamonds prepared according to Example and nanodiamonds before treatment, which were prepared in the first operation.

Referring to FIG. 3 in detail, the emission spectrum of the nanodiamonds before treatment prepared in the first operation shows only a water Raman peak having a low intensity at a wavelength 650 nm, but it can be confirmed that the emission spectrum of the fluorescent nanodiamonds prepared according to Example shows a peak having a very high intensity at a wide wavelength of 550 nm to 800 nm as compared with the nanodiamonds before treatment.

A spectrum of typical fluorescent nanodiamonds shows a zero-phonon line at wavelengths of 532 nm and 637 nm, but in nanodiamonds with a size of 50 nm or less, a shape of a zero-phonon line is not clear, and a position of a photoluminescence peak shifts toward a lower wavelength (Wilson, ER et al, (2019), The effect of particle size on nanodiamond fluorescence and colloidal properties in biological media, Nanotechnology, 30(38), 385704). It can be seen that, even in the case of the fluorescent nanodiamonds having an average particle diameter of 10 nm or less prepared according to one embodiment of the present invention, a zero-phonon line is not clear and a position of a peak shifts toward a lower wavelength.

Figure 4:
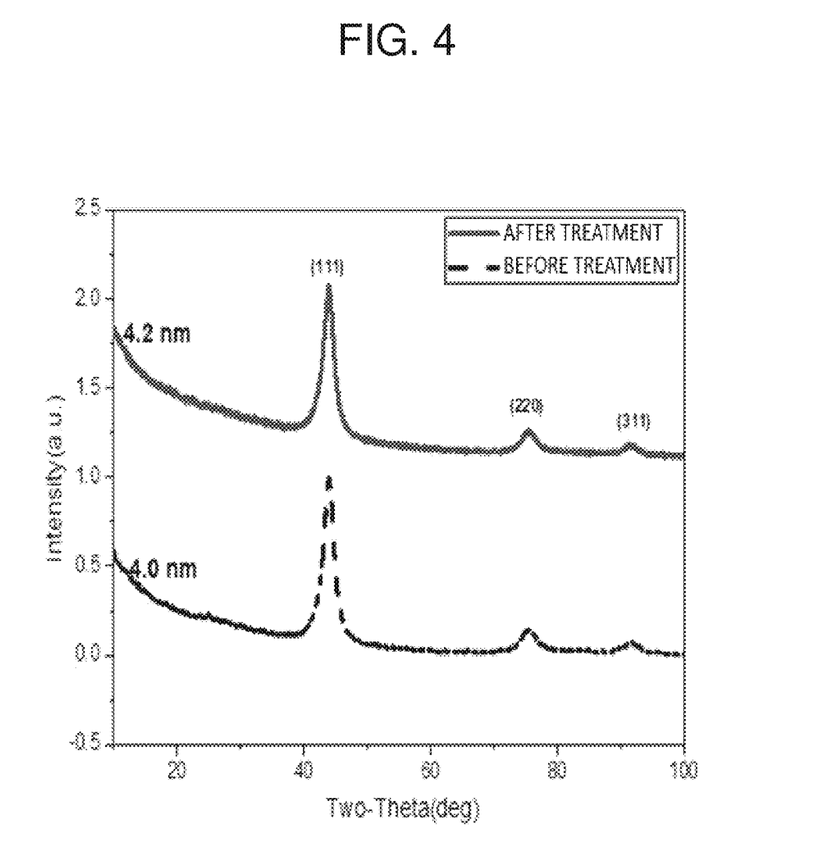
FIG. 4 is a graph showing an X-ray diffractometry (XRD) of the fluorescent nanodiamonds prepared according to one embodiment of the present invention.

FIG. 4 is a graph showing an X-ray diffractometry (XRD) of the fluorescent nanodiamonds prepared according to one embodiment of the present invention. Specifically, FIG. 4 is a graph showing a comparison between XRDs of the fluorescent nanodiamonds prepared according to Example and the nanodiamonds before treatment, which were prepared in the first operation.

In all of the fluorescent nanodiamonds prepared according to one embodiment and the nanodiamonds before treatment prepared in the first operation, peaks having high crystallinity appear on diamond crystal faces (111), (220), and (311). As a result, it can be confirmed that the fluorescent nanodiamonds prepared through the method according to one embodiment of the present invention maintain diamond crystallinity even after being subjected to the first to seventh operations. In addition, it could be seen that crystal sizes of the fluorescent nanodiamonds prepared according to Example and the nanodiamonds before treatment prepared in the first operation and the nanodiamonds before treatment prepared in the first step, which were calculated using a Scherrer equation, were respectively 4.0 nm and 4.2 nm and both were 10 nm or less.

Figure 5:
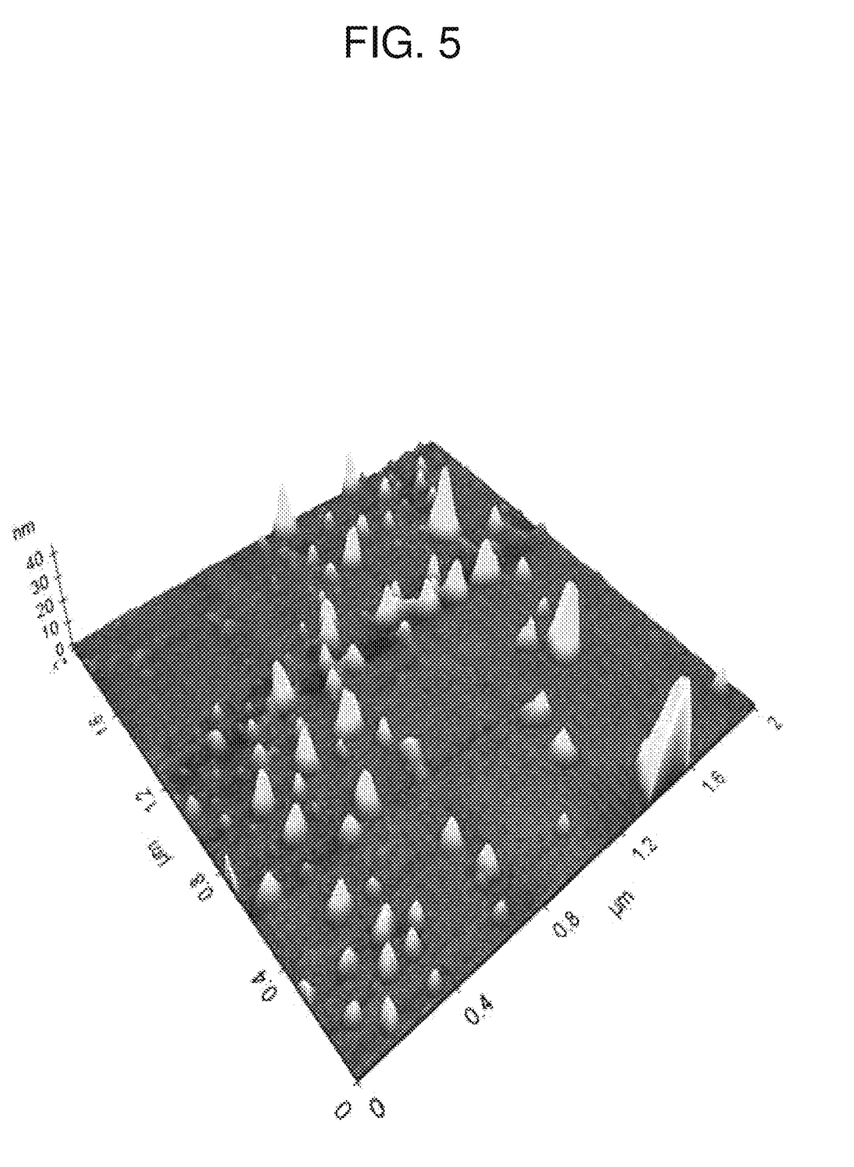
FIG. 5 is an atomic force microscope (AFM) image showing the fluorescent nanodiamonds prepared according to one embodiment of the present invention.

FIG. 5 is an atomic force microscope (AFM) image showing the fluorescent nanodiamonds prepared according to one embodiment of the present invention. An average size of the nanodiamonds prepared according to Example measured using an AFM was about 5 nm, and large lumps agglomerated during a sample providing process were not included in the value of 5 nm. It can be confirmed that the value of 5 nm is similar to the value calculated in FIG. 4.

Figure 6:
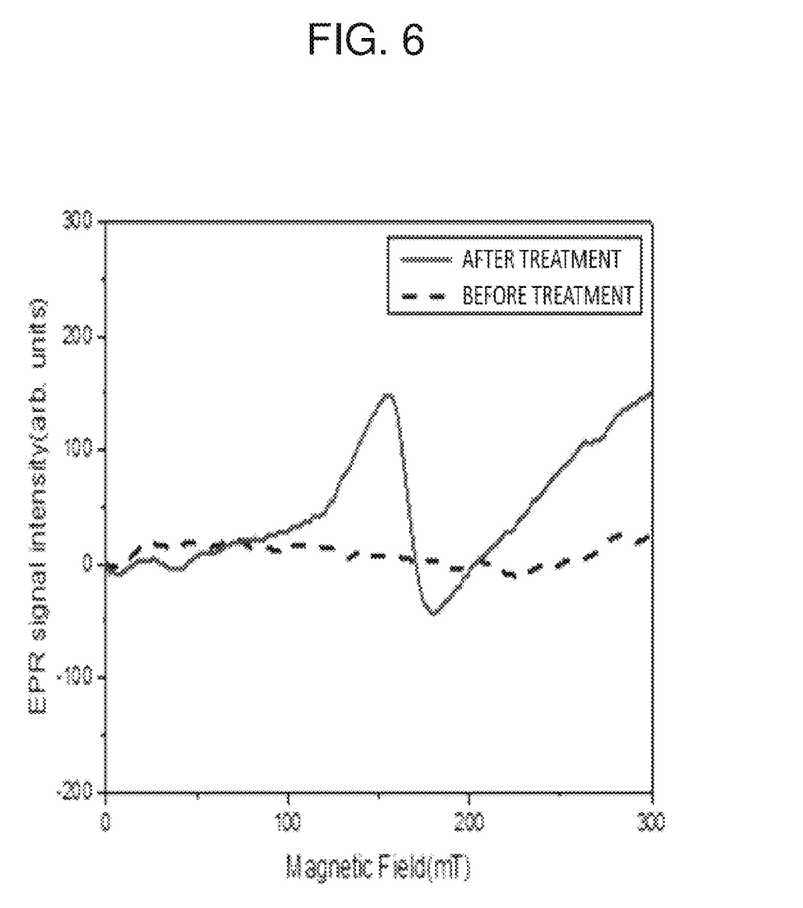
FIG. 6 is a graph showing an electron paramagnetic resonance (EPR) spectrum of the fluorescent nanodiamonds prepared according to one embodiment of the present invention.

FIG. 6 is a graph showing an electron paramagnetic resonance (EPR) spectrum of the fluorescent nanodiamonds prepared according to one embodiment of the present invention. Specifically, FIG. 6 is a graph showing a comparison between EPR resonance absorption lines of the fluorescent nanodiamonds prepared according to Example and the nanodiamonds before treatment, which were prepared in the first operation. Electron paramagnetic resonance measurement of a sample was performed while a frequency was fixed at 9.45 GHz and a magnetic field strength was increased from 0 mT to 300 mT. An EPR signal from nv⁻ is not viewed in a spectrum of the nanodiamonds prepared in the first operation, but a signal corresponding to nv⁻ can be confirmed in a spectrum of the fluorescent nanodiamonds prepared according to Example.

As a result of FIG. 6, it can be seen that nitrogen-vacancy color centers have been formed in the fluorescent nanodiamonds prepared through the preparing method according to one embodiment of the present invention.

In addition, it was confirmed that the method according to one embodiment of the present invention could provide fluorescent nanodiamonds having an average particle diameter of 10 nm or less and a high fluorescence color center concentration.

What is claimed is:

1. A method of fluorescent nanodiamonds production comprising:
   a first operation of preparing nanodiamonds having an average particle diameter of 10 nm or less;
   a second operation of implanting plasma ions into the nanodiamonds, wherein the second operation is performed at a plasma ion implantation voltage of −10 kV or more and −40 kV or less;
   a third operation of heat-treating the nanodiamonds implanted with the plasma ions under a vacuum or in an inert gas atmosphere;
   a fourth operation of oxygen treatment of the heat-treated nanodiamonds in the presence of oxygen to oxidize a surface of the nanodiamonds;
   a fifth operation of acid-treating the oxygen-treated nanodiamonds; and
   a sixth operation of centrifuging, cleaning, and drying the acid-treated nanodiamonds;
   wherein, in the second operation, the plasma ions are implanted at an incident ion dose of $10^{13}$ ions/cm² or greater and $10^{20}$ ions/cm² or less.

2. The method of claim 1, wherein the nanodiamonds having the average particle diameter of 10 nm or less in the first operation are prepared by a detonation method.

3. The method of claim 1, wherein the second operation is performed with at least one process gas selected from the group consisting of helium (He), nitrogen (N), neon (Ne), and argon (Ar).

4. The method of claim 1, wherein the second operation is performed at a pressure of 0.5 mTorr or more and 10 mTorr or less.

5. The method of claim 1, wherein the second operation is performed at a high voltage pulse width of 5 μs or more and 100 μs or less.

6. The method of claim 1, wherein the second operation is performed at a pulse frequency of 1 Hz or more and 1,000 Hz or less.

7. The method of claim 1, wherein, in the third operation, a heat treatment temperature under the vacuum or inert gas atmosphere is 600° C. or more and 1100° C. or less.

8. The method of claim 1, wherein, in the third operation, a heat treatment time under the vacuum or inert gas atmosphere is 10 seconds or more and 10 hours or less.

9. The method of claim 1, wherein, in the fourth operation, a heat treatment temperature under the gas atmosphere including oxygen is 350° C. or more and 600° C. or less.

10. The method of claim 1, wherein, in the fourth operation, a heat treatment time under the gas atmosphere including oxygen is one hour or more and 70 hours or less.

11. The method of claim 1, wherein an acid of the fifth operation is a mixture of hydrofluoric acid (HF) and nitric acid ($HNO_3$).

12. The method of claim 1, wherein the fifth operation is performed at a temperature of 40° C. or more and 150° C. or less.

13. The method of claim 1, wherein the centrifuging of the sixth operation is performed at a centrifugal acceleration of 1,000 g or more and 60,000 g or less.

14. The method of claim 1, wherein the centrifuging of the sixth operation is performed for a time of 10 minutes or more and 10 hours or less.

15. The method of claim 1, wherein the seventh operation is performed at a temperature of 40° C. or more and 200° C. or less.

16. The method of claim 1, wherein the seventh operation is performed at a pressure of $10^{-1}$ Torr or more and 770 Torr or less.

* * * * *